(12) United States Patent
Ritter

(10) Patent No.: US 7,812,603 B2
(45) Date of Patent: Oct. 12, 2010

(54) METHOD FOR DETERMINING LOCAL DEVIATIONS OF A MAIN MAGNETIC FIELD OF A MAGNETIC RESONANCE DEVICE

(75) Inventor: Dieter Ritter, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 29 days.

(21) Appl. No.: 12/218,708

(22) Filed: Jul. 17, 2008

(65) Prior Publication Data

US 2009/0021258 A1    Jan. 22, 2009

(30) Foreign Application Priority Data

Jul. 20, 2007    (DE) .................. 10 2007 033 874

(51) Int. Cl.
*G01V 3/00* (2006.01)
(52) U.S. Cl. ..................... 324/307; 324/309
(58) Field of Classification Search ........... 324/307, 324/309, 320
See application file for complete search history.

(56) References Cited

U.S. PATENT DOCUMENTS

| | | | |
|---|---|---|---|
| 4,585,992 A * | 4/1986 | Maudsley et al. ........... 324/309 |
| 4,661,775 A * | 4/1987 | Kormos et al. ............ 324/307 |
| 4,970,457 A | 11/1990 | Kaufman et al. | |
| 5,581,184 A | 12/1996 | Heid | |
| 5,823,959 A * | 10/1998 | Rasche ................. 600/410 |
| 5,886,524 A | 3/1999 | Krieg | |
| 6,150,815 A | 11/2000 | Janzen et al. | |
| 6,252,401 B1 | 6/2001 | Werthner et al. | |
| 2002/0048340 A1 | 4/2002 | Schaeffter et al. | |
| 2004/0032261 A1 | 2/2004 | Schweikard et al. | |
| 2005/0035763 A1 | 2/2005 | Canda et al. | |
| 2007/0018645 A1 | 1/2007 | Wang et al. | |
| 2007/0142723 A1 | 6/2007 | Leach et al. | |
| 2008/0068012 A1 | 3/2008 | Werthner | |

FOREIGN PATENT DOCUMENTS

DE    4445782 C1    7/1996

(Continued)

OTHER PUBLICATIONS

Rueckert, D. et al.; Nonrigid Registration Using Free-Form Deformations: Application to Breast MR Images; IEEE Transactions on Medical Imaging, vol. 18, No. 8, Aug. 1999; 8; Others;1999.

(Continued)

*Primary Examiner*—Louis M Arana
(74) *Attorney, Agent, or Firm*—Harness, Dickey & Pierce, P.L.C.

(57) ABSTRACT

The invention relates to a method for the determination of local deviations of a main magnetic field of a magnetic resonance device from a setpoint value, comprising: loading of a first image data record of an examination region recorded by means of the magnetic resonance device with a first frequency encoding gradient; loading of a second image data record of the same examination region recorded by means of the magnetic resonance device with a second frequency encoding gradient, with the first and the second frequency encoding gradient being different; reception of a transformation displacement field as the end result of a recording of the first and the second image data record; calculation of local deviations of the main magnetic field from a setpoint value on the basis of the calculated transformation displacement field; and display or storage of the calculated local deviations of the main magnetic field.

12 Claims, 2 Drawing Sheets

FOREIGN PATENT DOCUMENTS

| | | |
|---|---|---|
| DE | 19540837 B4 | 5/1997 |
| DE | 19829850 C2 | 1/2000 |
| DE | 10337241 | 3/2005 |
| DE | 102006033248 | 1/2008 |
| EP | 0391515 A2 | 10/1990 |
| EP | 1209481 A1 | 5/2002 |
| WO | WO 9530908 A1 | 11/1995 |

OTHER PUBLICATIONS

Rohlfing, Torsten; Multimodale Datenfusion für die bildgesteuerte Neurochiurgie und Strahlentherapie; Dissertation; Berlin; Others; 2000.

Lee, S. et al.; Scattered Data Interpolation with Multilevel B-Splines; IEEE Transactions on Visualization and Computer Graphics, vol. 3, No. 3, Jul.-Sep. 1997; 3; Magazine; 1997.

Seim, Heiko; Automatische Registrierung mittels Mutual-Information am Beispiel von Schädel-CT-und MR-Datensätzen; Otto-von-Guericke-Universität Magdeburg; Praktikumsbericht 13.04.2004-10.09.2004; Magdeburg; Others; 2004.

Skare, Andersson: "Correction of MR Image Distortions Induced by Metallic Objects Using a 3D Cubic B-Spline Basis Set: Application to Stereotactic Surgical Planning" in: Magnetic Resonance in Medicine 54:169-181 (2005); Magazine.

* cited by examiner

METHOD FOR DETERMINING LOCAL DEVIATIONS OF A MAIN MAGNETIC FIELD OF A MAGNETIC RESONANCE DEVICE

CROSS REFERENCE TO RELATED APPLICATIONS

This application claims priority of German application No. 10 2007 033 874.2 filed Jul. 20, 2007, which is incorporated by reference herein in its entirety.

FIELD OF THE INVENTION

The invention relates to methods for the determination of local deviations of a main magnetic field of a magnetic resonance device from a setpoint value.

BACKGROUND OF THE INVENTION

Magnetic resonance imaging is a known technology able to create images of the interior of an object to be examined. To do this, it employs the dependence of the precision frequencies (Larmor frequencies) of excited spins on the magnetic field strength of the prevailing magnetic field of the magnetic resonance device for local resolution. Hereby, the prevailing magnetic field comprises the main magnetic field of the magnetic resonance device and applied gradient magnetic fields. Conventional methods for the reconstruction of image data records from magnetic resonance signals require a homogeneous main magnetic field and strictly linear gradient magnetic fields.

Due to the dependence of Larmor frequencies on the prevailing magnetic field, inhomogeneities of the main magnetic field result in geometric distortions along the frequency encoding direction (read-out direction) in the image data records obtained from the magnetic resonance signals. Hereby, the distortions are proportional to local deviations of the main magnetic field and vice versa proportional to the strength of the frequency encoding gradient.

In practice, it is not possible completely to avoid inhomogeneities of the main magnetic field of this kind. Nevertheless, within a measuring volume of a magnetic resonance device, the deviations of the main magnetic field, i.e. the inhomogeneity, should still be less than 3 ppm (ppm: "parts per million").

Inhomogeneities of main magnetic fields in magnetic resonance devices are for example design-induced, i.e. they are, for example, dependent upon the design and winding geometry of the main field magnets, the screening and shim devices provided. Inhomogeneities of the main magnetic field induced in this way are static, i.e. they remain substantially temporally constant.

It is usual to employ a measuring phantom to determine static inhomogeneities of the main magnetic field. For this, the measuring phantom is used to measure the actual magnetic field at several measuring points on a surface of a conductor-free volume. The values measured at the measuring points can be used in a known way to determine the main magnetic field at every point within the volume. Hereby, the accuracy of the determination of the main magnetic field depends, on the one hand, on the measuring accuracy of the measuring phantom and, on the other, on the accuracy of the algorithm for the determination of the main magnetic field from the measuring points. The inhomogeneity is then obtained, for example, from the relative deviation of the measured main magnetic field from a setpoint value.

Further causes of inhomogeneities of a magnetic field in a magnetic resonance unit are, for example, susceptibility changes caused by an object to be examined introduced into the magnetic resonance unit, dynamic interference from eddy currents or artifacts such as "Chemical Shift", flow artifacts or movements of the object to be examined. Inhomogeneities caused in this way depend upon the situation in question, for example the type of the examination and the object to be examined.

Any kind of distortion in image data records is undesirable, in particular in medical image data records, since they could falsify, or at least complicate, a diagnosis. Due to the various possible causes and types of distortion there are already various methods which utilize knowledge of the inhomogeneities of the main magnetic field to correct distortion in image data records.

For example, WO 95/30908 A1 discloses a method in which a generalized Fresnel transform (GFT reconstruction) is performed in the read-out direction. The GFT reconstruction takes into account a known position dependence of the main magnetic field in the read-out direction in order to be able to correct distortion and intensity errors during the transformation from the measured data space (k-space) into the position space.

In addition, the most accurate possible determination of local deviations of the main magnetic field of a magnetic resonance device is important for an optimum improvement of the main magnetic field homogeneity, for example in the form of shim elements. The improvement of the main magnetic field homogeneity is in turn of great importance for the improvement of applications such as measurements with a large metering field or spectroscopic examinations.

SUMMARY OF THE INVENTION

The object of the invention is therefore to be able to determine local deviations of a main magnetic field of a magnetic resonance device from a setpoint value rapidly and effectively.

The object is achieved by a method according to the claims.

Hereby, the method according to the invention for the determination of local deviations of a main magnetic field of a magnetic resonance device from a setpoint value comprises the following steps:

loading of a first image data record of an examination region recorded by means of the magnetic resonance device with a first frequency encoding gradient, loading of a second image data record of the same examination region recorded by means of the magnetic resonance device with a second frequency encoding gradient, with the first and the second frequency encoding gradient being different, reception of a transformation displacement field as the end result of a recording of the first and the second image data record, calculation of local deviations of the main magnetic field from a setpoint value on the basis of the calculated transformation displacement field, display and/or storage of the calculated local deviations of the main magnetic field.

Advantageously, an elastic recording method is used for the recording. Elastic recording methods, such as those described below for example, produce recording results with a high and reliable quality in a rapid time.

One great advantage of the method according to the invention is the fact that the determination of the local deviations of the main magnetic field is always based on the current situation in the magnetic resonance unit. This means that instabilities of the main magnetic field over lengthy periods have no influence on the method according to the invention. In addition, local main magnetic field changes introduced by patients or other objects to be examined are taken into account because the current actual status of the main magnetic field is also determined.

BRIEF DESCRIPTION OF THE DRAWINGS

Further advantages and details of the present invention may be derived from the exemplary embodiments described in the following and with the aid of the drawings. The examples given do not represent a restriction of the invention. The drawings show.

DETAILED DESCRIPTION OF THE INVENTION

Figure 1:
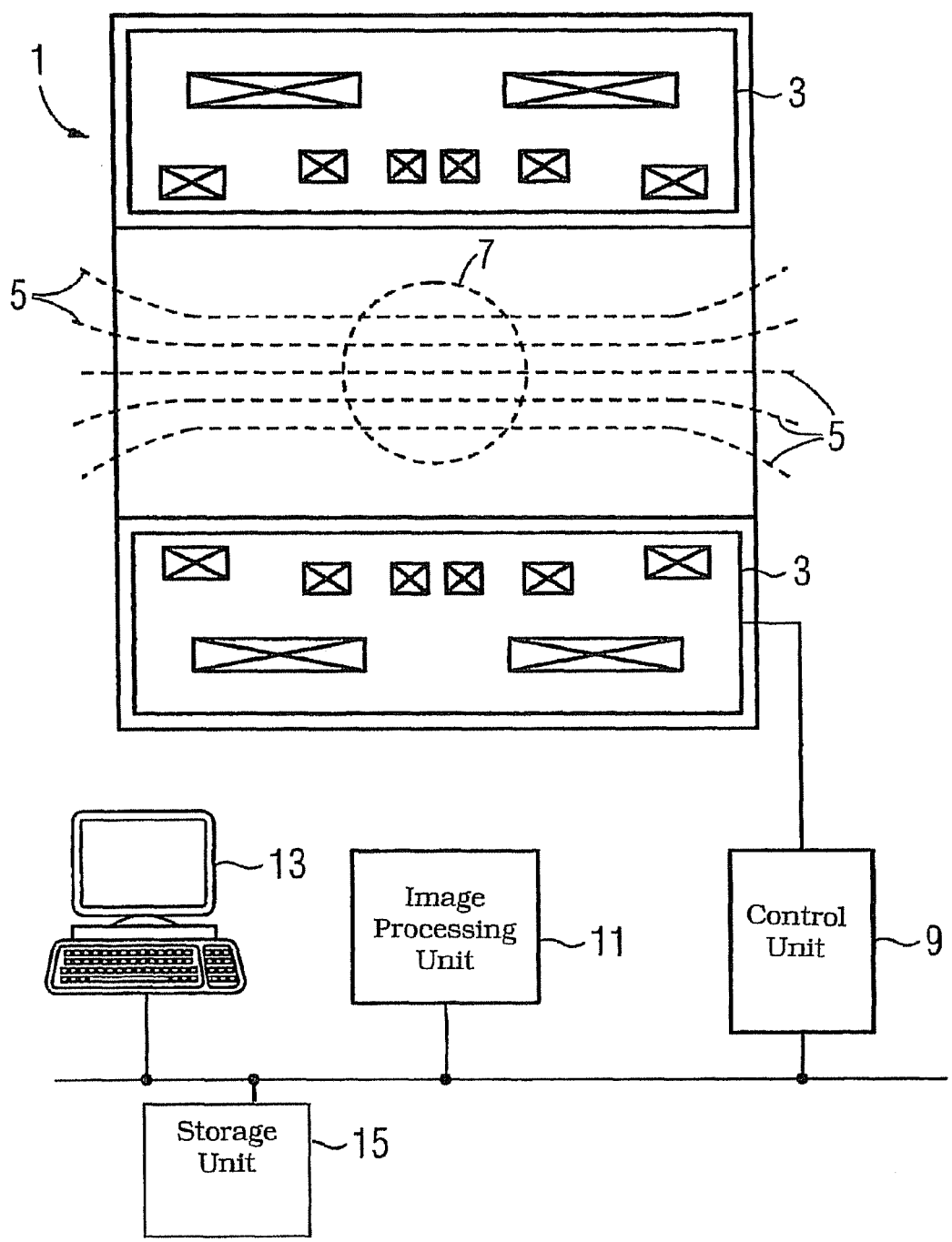
FIG. 1 a schematic diagram of the configuration of a magnetic resonance device.

FIG. 1 is a schematic diagram of the configuration of a magnetic resonance device 1 in a side view. This only shows the parts essential for the invention. Further parts, such as, for example, a bed, local coils, gradient coils and units for controlling said device are sufficiently well known from the prior art and are not shown for purposes of clarity.

The magnetic resonance unit 1 comprises in particular a superconducting main field magnet 3. The main field magnet 3, usually a cryomagnet 3 with a tunnel-shaped opening or an open magnet, generates a strong main magnetic field 5 (shown by way of example by dashed magnetic force lines), which is usually 0.2 tesla to 3 tesla and more. Apart from small local deviations from a setpoint value, the main magnetic field 5 is homogeneous in a measuring volume 7 of the magnetic resonance device 1.

In order to examine an object by means of magnetic resonance imaging, different magnetic fields whose temporal and spatial characteristics are as precisely matched to each other as possible are beamed at the body. The magnetic resonance signals generated thereby are measured as measured data.

An object to be examined is mounted on a bed (not shown here) and positioned for the recording of measured data in the measuring volume 7.

A control unit 9 controls the magnetic resonance unit, in particular during the acquisition of the measured data.

From the measured data, an image processing unit 11 generates an image data record, which is displayed to a user via an operator console 13 or stored in a storage unit 15.

Hereby, the image processing unit 11 is embodied so that the method according to the invention can be performed with the image processing unit 11 optionally together with the control unit 9. For this, for example, a computer program according to the invention may be executed on the image processing unit 11 and/or installed on the control unit 9.

An image processing unit 11 embodied for the performance of the method according to the invention can, however, also be operated independently of a magnetic resonance unit 1.

Figure 2:
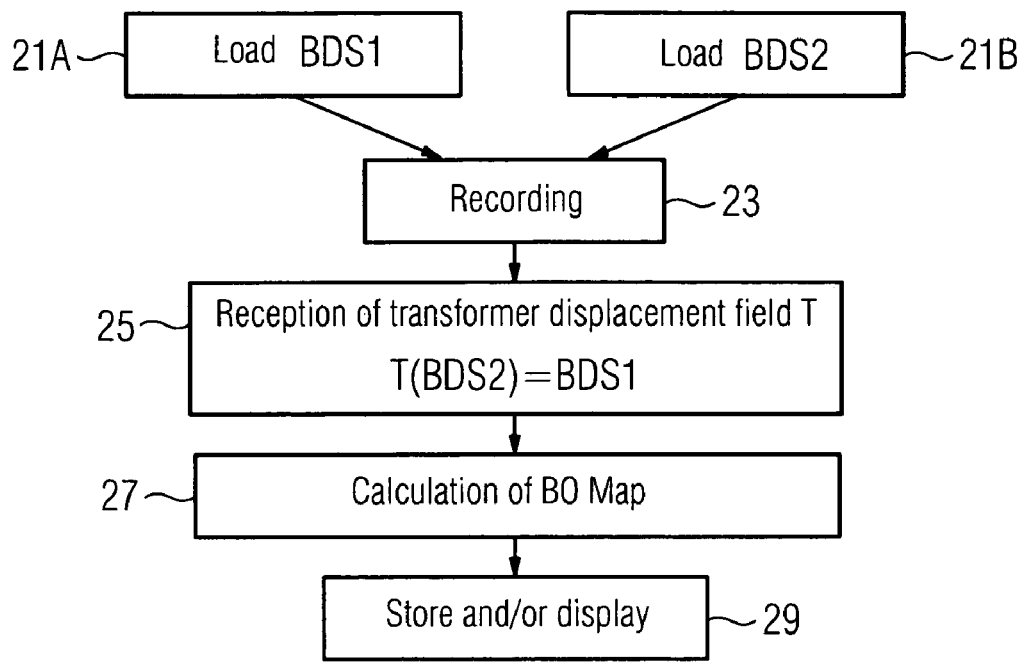
FIG. 2 a schematic flowchart of the method according to the invention.

FIG. 2 explains with reference to a flowchart the method according to the invention for the correction of distortion in image data records recorded by means of a magnetic resonance device. For this, a first image data record (in short: BDS1) and a second image data record (in short: BDS2) (Blocks 21A and 21B) are loaded.

The first image data record and the second image data record are images of the same examination region of an object to be examined and were each recorded with the same magnetic resonance unit. Hereby, the first image data record was recorded with a first frequency encoding gradient and the second image data record with a second frequency encoding gradient, with the first and the second frequency encoding gradient differing in their strength and/or direction.

The different frequency encoding gradients means the distortion in the first and second image data record is also different. Therefore, the two loaded image data records are not identical.

In a further step (Block 23), the first and the second image data record are recorded elastically, with the transformations required for the recording of the two image data records being stored.

During the recording, the superimposed transformed data have to be compared with the aid of an evaluation function. This function must assume its optimum for cases in which the data are recorded correctly. For this, a similarity of the first and the second image data record is determined with the aid of a similarity function, which evaluates the similarity of the two image data records by means of a degree of similarity.

Examples of degrees of similarity are for example: region uniformity or quotient uniformity, which are based on the minimization of suitably defined gray scale variances, or correlation ratio, mutual information or normalized mutual information each of which are based on the term entropy from information theory. More details of the individual degrees of similarity are known from specialist literature.

A similarity function $NMI(G_1,G_2)$ of image data records $G_1$ and $G_2$ with normalized mutual information (NMI) as a degree of similarity is hereby defined as:

$$NMI(G_1, G_2) = \sum_{g_1} \sum_{g_2} p(g_1, g_2) * \log \frac{p(g_1, g_2)}{p(g_1) * p(g_2)},$$

where $p(g_i)$ is the one-dimensional probability distribution of $G_i$ and $p(g_1,g_2)$ is the two-dimensional probability distribution of $G_1$ and $G_2$.

Hence, the normalized mutual information refers to the common histogram $H(G_1,G_2)$ and describes the divergence between completely uncorrelated distributions and the histogram H.

The advantage of NMI as a degree of similarity consists in the fact that that the image data records to be recorded only have to have the same structure, but not the same intensities. It is therefore particularly suitable for recording multimodal image data records and is in particular favorable when recording two magnetic resonance image data records. In addition, NMI is largely independent of the degree of overlapping of the image data records to be recorded and the size of the homogeneous marginal areas outside the object to be examined.

The recording further comprises a mapping function, advantageously for example a free-form deformation (FFD), which, for example, maps the second image data record BDS2 in a transformed image data record T(BDS2). Hereby, the purpose of the recording is to use the mapping function to transform the second image data record into the first image data record or vice versa. The following explains by way of example the recording of two two-dimensional image data records. The recording of three-dimensional image data records takes place in a similar way.

For recording two two-dimensional image data records as accurately as possible, a mapping function using a quantity of local two-dimensional B-spline functions with their control points as transformation parameters is advantageous.

For this, a control point grid $\Phi$ is placed, for example, in the xy-plane with initial $N_x * N_y$ control points $\phi_{ij}=(x_i^\Phi, y_j^\Phi)$ ($i=[1, N_x]$; $j=[1, N_y]$) and initial grid spacings $\delta_x, \delta_y$ over the image data record BDS2 to be transformed. The position of the transformed point $(x_p, y_p)$ is determined on the basis of the control points $\phi_{ij}=(x_i^\Phi, y_j^\Phi)$ and with the aid of the main functions $B_m(u)$ and $B_n(v)$. Hereby, the associated B-spline function for the elastic deformation of the second image data record BDS2 is:

$$\begin{pmatrix} x_p \\ y_p \end{pmatrix} = \sum_{m=0}^{3} \sum_{n=0}^{3} B_m(u) B_n(v) \underline{A} \begin{pmatrix} x_{i+m-1}^\varphi \\ y_{j+n-1}^\varphi \end{pmatrix},$$

with $$i = \left\lfloor \frac{x_p}{\delta_x} \right\rfloor;$$

$$u = \frac{x_p}{\delta_x} - i;$$

$$j = \left\lfloor \frac{y_p}{\delta_y} \right\rfloor;$$

$$v = \frac{y_p}{\delta_y} - j;$$

$$B_0(t) = (-t^3 + 3t^2 - 3t + 1)/6;$$

$$B_1(t) = (3t^3 - 6t^2 + 4)/6;$$

$$B_2(t) = (-3t^3 + 3t^2 + 3t + 1)/6;$$

$$B_3(t) = t^3/6.$$

The parameters u and v indicate the position in the cell (i,j) and u,v .di-elect cons. [0.1] is valid. The matrix A is an affine transformation matrix for a first quick "coarse adjustment". It comprises, for example, a rotation, a scaling or translation etc.

In order to achieve the maximum of the normalized mutual information, the control point grid $\Phi$ used, that is the position of the control points $\phi_{ij}$, is advantageously optimized by means of an optimization function.

Hereby, a gradient method (gradient ascent) is advantageous. For this, an iterative loop is introduced over the l= 1 ... 2*Nx*Ny parameters $\underline{\phi}$ of the image to be transformed therewith BDS2(x,y), with which the position of the control points is adjusted in each case according to the degree of NMI improvement:

$$\underline{\varphi}^{m+1} = \underline{\varphi}^m + \Delta \underline{\varphi}^m;$$

$$\underline{\varphi} = (x_0^\varphi, y_0^\varphi, x_1^\varphi, y_1^\varphi \ldots x_{N_x}^\varphi, y_{N_y}^\varphi);$$

$$\Delta \underline{\varphi}_l^m = \eta * \frac{\partial}{\partial \varphi_l} NMI(BDS1, T(BDS2)).$$

The global maximum of the normalized mutual information is much easier to find with a multi-scale control grid in which its resolution is increased at certain points k in the iterative loop. For this, new control points are introduced, for example equidistantly at half the original grid point spacing, the number of which is thereby increased each time to $1^{k+1}=$ $(2*N_x^k-3)*(2*N_y^k-3)$. Hereby, the new control point parameters obtained from the old ones are:

$$\varphi_{2i,2j}^{k+1} = \frac{1}{64}[\varphi_{i-1,j-1}^k + \varphi_{i-1,j+1}^k + \varphi_{i+1,j-1}^k +$$
$$\varphi_{i+1,j+1}^k + 6(\varphi_{i-1,j}^k + \varphi_{i,j-1}^k + \varphi_{i,j+1}^k + \varphi_{i+1,j}^k) + 36\varphi_{i,j}^k];$$

$$\varphi_{2i,2j+1}^{k+1} = \frac{1}{16}[\varphi_{i-1,j}^k + \varphi_{i-1,j+1}^k + \varphi_{i+1,j}^k + \varphi_{i+1,j+1}^k + 6(\varphi_{i,j}^k + \varphi_{i,j+1}^k)];$$

$$\varphi_{2i+1,2j}^{k+1} = \frac{1}{16}[\varphi_{i,j-1}^k + \varphi_{i,j+1}^k + \varphi_{i+1,j-1}^k + \varphi_{i+1,j+1}^k + 6(\varphi_{i,j}^k + \varphi_{i+1,j}^k)];$$

$$\varphi_{2i+1,2j+1}^{k+1} = \frac{1}{4}[\varphi_{i,j}^k + \varphi_{i,j+1}^k + \varphi_{i+1,j}^k + \varphi_{i+1,j+1}^k].$$

The use of an optimization function of this kind enables the geometry of the transformed image data record T(BDS2) to be adapted virtually completely to that of the first image data record BDS1 and the maximum of the normalized mutual information for T(BDS2) and BDS1 is achieved.

As a rule, the pixels of the transformed second image data record T(BDS2) displaced by this transformation do not fall exactly on a corresponding pixel of the first image data record comprising regularly distributed pixels. Therefore, it makes sense to perform an intensity interpolation to determine the intensity values of each regularly distributed pixel of the image data record in order not to degrade the resolution of the transformed image data record.

This can take place by a linear intensity interpolation or a so-called "nearest neighbor" interpolation or a B-spline method. These methods are sufficiently well known from the prior art. However, the use of one of the two first-mentioned methods can result in a coarsening of the resolution of the corrected image data record and so, to achieve the most accurate possible intensity interpolation, advantageously a further B-spline function is used.

Hereby, with, for example, a two-dimensional B-spline interpolation, the intensity of the transformed second image data record $I^{T(BDS)}$ is determined at an image point $(x_p, y_p)$ corresponding to a pixel of the transformed image data record by means of the main functions $B_m(u)$ and $B_n(v)$, and the intensities $I_{BDS2}(x_{i+m-1}, y_{j+n-1})$ at surrounding image points $(x_{i+m-1}, y_{j+n-1})$ corresponding to the originally displaced pixels as follows:

$$I^{T(BDS2)}(x_p, y_p) \sum_{m=0}^{3} \sum_{n=0}^{3} B_m(u) B_n(v) I_{BDS2}(x_{i+m-1}, y_{j+n-1}),$$

where: $i = \lfloor x_p \rfloor$; $u = x_p - \lfloor x_p \rfloor$; $j = \lfloor y_p \rfloor$; $v = y_p - \lfloor y_p \rfloor$;

and $B_0(t) = (-t^3 + 3t^2 - 3t + 1)/6$; $B_1(t) = (3t^3 - 6t^2 + 4)/6$;

$B_2(t) = (-3t^3 + 3t^2 + 3t + 1)/6$; $B_3(t) = t^3/6$.

The purpose of the recording is to optimize the transformation parameters of the mapping function in such a way that a second image data record T(BDS2) transformed in this way and the first image data record (BDS1) achieves the global maximum of the similarity function. In this way, the second image data record is transformed into the first image data record, i.e. the transformed second image data record T(BDS2) geometrically corresponds to the first image data record BDS1.

In a similar way, obviously during the recording it is also possible for the first image data record to be transformed into the second image data record and the global maximum of the similarity function from a transformed first image data record T(BDS1) and the second image data record (BDS2) to be sought. This is obtained by a simple renaming of the image data records. The following addresses an example in which the second image data record is transformed into the first image data record.

The optimized parameters $\phi_{ij}$ of the recording produce a transformation displacement field, which transforms the second image data record into the first image data record (Block 25).

The transformation displacement field indicates for every pixel of the second image data record a translation vector $(\Delta x, \Delta y)$ specifying in each case how the pixels of the second image data record have to be displaced so that the second image data record is transformed into the first image data record:

$$\begin{pmatrix} \Delta x \\ \Delta y \end{pmatrix} = \sum_{m=0}^{3} \sum_{n=0}^{3} B_m(u) B_n(v) \begin{pmatrix} x_{i+m-1}^\varphi \\ y_{j+n-1}^\varphi \end{pmatrix}.$$

The transformation displacement field and the values $G_1^{ro}$ and/or $G_2^{ro}$ for the strength of the first and second frequency encoding gradient may be used to calculate local deviations of the main field magnet (Block 27). These local deviations can be displayed, for example, in a so-called B0-Map. A B0-Map of this kind can be displayed, for example, as a height profile in a cutting plane through the measuring volume. Hereby, the height profile indicates, for example, the relative main field inhomogeneity at the relevant location in the measuring volume.

Hereby, the calculation of a relative main magnetic field inhomogeneity $\delta_{B0}$, indicating the ratio of a deviation of the local main magnetic field from a setpoint value $B_0$ and the setpoint value $B_0$, takes place as follows:

In the event that the first and the second frequency encoding gradients differ in their direction, the following applies:

$$\delta_{B0} = \frac{\Delta x * G_1^{ro}}{B_0};$$

$$\delta_{B0} = \frac{\Delta y * G_2^{ro}}{B_0};$$

$$\delta_{B0} = \frac{\Delta x * G_1^{ro} + \Delta y * G_2^{ro}}{2 * B_0}.$$

As is evident, the relative main magnetic field inhomogeneity can be calculated from both the values of the first and the values of the second image data record or, for even higher accuracy, a mean value of the two means of calculation selected.

In the event that the first and the second frequency encoding gradients point in the same direction, the following applies for the calculation of the relative main magnetic field inhomogeneity in each case:

$$\delta_{B0} = \frac{\Delta x_{ro}}{\left(\frac{1}{G_1^{ro}} - \frac{1}{G_2^{ro}}\right) * B_0}.$$

B0-Maps created in this way can also be displayed and/or stored (Block 29). The information on the local deviations of the main field magnets is, for example, used advantageously for directory correction methods or to improve shim devices.

Figure 3:
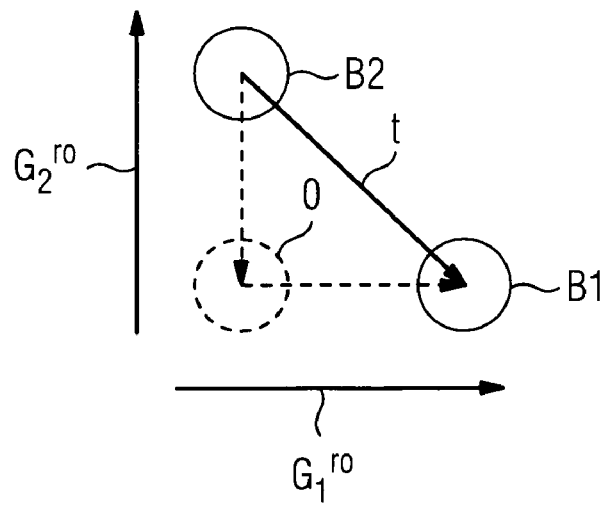
FIGS. 3-4 schematic illustrations of main concepts for the calculation of corrections.

FIG. 3 is a schematic illustration of main concepts for the calculation of corrections in a first and a second image data record recorded with a first frequency encoding gradient $G_1^{ro}$ and a second frequency encoding gradient $G_2^{ro}$, which differ in their direction (arrows left outside and bottom).

The circle drawn in dotted line O represents a pixel at its, initially unknown, original location. The circles B1/B2 each indicate the distorted position of the pixel in the first/second image data record. As is evident, in each case the position is displaced in the direction of the associated frequency encoding gradient. For reasons of simplicity, the frequency encoding gradients are shown with the same strength, with the length of the arrows for the frequency encoding gradients here illustrating the respective strength.

As described above, obtained from the recording of the two image data records as part of the transformation displacement field is a translation vector $t=(\Delta x, \Delta y)$, which transforms the pixel B2 displaced in the second image data record into pixel B1 displaced in the first image data record. The splitting of the translation vector t into its parts parallel to the frequency encoding directions (dashed arrows) provides the correction curves for the first and the second image data record, which displace the displaced pixels B1 or B2 back to their original location 0. Hereby, care must be taken to select the correct signs. The splitting of the translation vectors t supplies the dashed arrows from B2 to O and from O to B1. However, the correction vectors K̄1 and K̄2 must always point from B2 or B1 to O.

Figure 4:
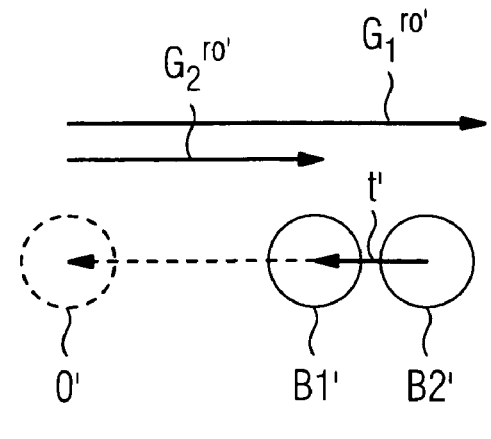

FIG. 4 is a schematic illustration of main concepts for the calculation of corrections in a first and a second image data record, which were recorded with a first frequency encoding gradient $G_1^{ro\prime}$ and a second frequency encoding gradient $G_2^{ro\prime}$, which do not differ in their direction but only in their strength (arrows top).

As in FIG. 3, the dashed circle O' in FIG. 4 represents a pixel in its original location and the circles B1' and B2' each indicate the distorted position of the pixel in the first or second image data record. As is evident, once again, here the position is in each case displaced in the direction of the associated frequency encoding gradient, wherein, due to the reversed proportional dependence, the weaker the frequency encoding gradient, the greater the distortion.

As described above for a case of this kind, here once again the recording of the two image data records results in a translation vector t', which transforms the pixel from the second image data record into the pixel from the first image data record. In such a case, as described above, in addition to the translation vector, at least the ratio of strengths of the frequency encoding gradient is required in order to calculate the correction vectors (dashed arrows from B1' or B2' toward O') for the first and/or the second image data record.

The invention claimed is:

1. A method for determining a local deviation of a main magnetic field of a magnetic resonance device, comprising:
   recording a first image data record of an examination region by the magnetic resonance device with a first frequency encoding gradient;
   recording a second image data record of the examination region by the magnetic resonance device with a second frequency encoding gradient being different from the first frequency encoding gradient, the first and the second frequency encoding gradients being different in strength;
   calculating a transformation displacement field based on the first and the second image data records;

determining the local deviation of the main magnetic field from a setpoint value based on the calculated transformation displacement field; and displaying the calculated local deviation of the main magnetic field.

2. The method as claimed in claim 1, wherein the first and the second frequency encoding gradients comprise a same direction.

3. The method as claimed in claim 2, wherein the first or the second image data records is corrected by a ratio of the strengths.

4. The method as claimed in claim 3, wherein an intensity of the first or the second image data record is interpolated.

5. The method as claimed in claim 4, wherein the intensity of the first or the second image data record is interpolated by a B-spline method.

6. The method as claimed in claim 1, wherein the first and the second frequency encoding gradients are different in directions.

7. The method as claimed in claim 6, wherein the first or the second image data records is corrected by splitting the transformation displacement field into components parallel to the directions.

8. The method as claimed in claim 1, further comprising storing the calculated local deviation of the main magnetic field.

9. The method as claimed in claim 1, wherein the second image data record is transformed into the first image data record based on the transformation displacement field.

10. The method as claimed in claim 1, wherein the first image data record is transformed into the second image data record based on the transformation displacement field.

11. A tangible computer readable medium, when executed on a computer, configured to instruct the computer to:

calculates a transformation displacement field based on a first image data record and a second image data record of an examination region recorded by the magnetic resonance device with different frequency encoding gradients, the frequency encoding gradients being different in strength, and determines the local deviation of the main magnetic field from a setpoint value based on the calculated transformation displacement field.

12. A magnetic resonance unit, comprising:

an image recording device that records a first image data record and a second image data record of an examination region with different frequency encoding gradients, the frequency encoding gradients being different in strength; and an image processing unit that:

calculates a transformation displacement field based on the first and the second image data records, and determines the local deviation of the main magnetic field from a setpoint value based on the calculated transformation displacement field.

* * * * *